US012660680B2

(12) United States Patent
Candadai et al.

(10) Patent No.: US 12,660,680 B2
(45) Date of Patent: Jun. 16, 2026

(54) SUBSTRATE ARCHITECTURE FOR ENHANCED ELECTROSTATIC CHUCKING

(71) Applicant: Intel Corporation, Santa Clara, CA (US)

(72) Inventors: Aaditya Anand Candadai, Chandler, AZ (US); Nicholas Haehn, Scottsdale, AZ (US); Ao Wang, Chandler, AZ (US); Whitney Bryks, Tempe, AZ (US); Srinivas Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/060,592

(22) Filed: Dec. 1, 2022

(65) Prior Publication Data

US 2024/0186197 A1 Jun. 6, 2024

(51) Int. Cl.
*H10W 76/40* (2026.01)

(52) U.S. Cl.
CPC .................................. *H10W 76/40* (2026.01)

(58) Field of Classification Search
None
See application file for complete search history.

(56) References Cited

U.S. PATENT DOCUMENTS

2016/0204000 A1* 7/2016 Kubota ................. H01L 21/046
438/522

* cited by examiner

*Primary Examiner* — Kyoung Lee
(74) *Attorney, Agent, or Firm* — Viering, Jentschura & Partner mbB

(57) ABSTRACT

The present disclosure is directed to a semiconductor panel providing a laminated structure and a plurality of electrically isolated structures distributed throughout the laminated structure to increase an attraction between the laminated structure and an electrostatic chuck. In an aspect, the electrically isolated structures are positioned in spaces in the semiconductor panel without electrically active devices and interconnects. In yet another aspect, the present method provides a semiconductor panel and forming a plurality of electrically isolated structures in selected positions on the semiconductor panel and an electrostatic chuck configured to carry an electrostatic charge for producing an electrostatic force at its top surface, placing the semiconductor panel on the electrostatic chuck, and activating the electrostatic chuck to induce polarization at the top surface to produce an attractive force having a greater magnitude at the positions with the plurality of electrically isolated structures.

20 Claims, 7 Drawing Sheets

301a

10x

301b 1.5-2x

301c

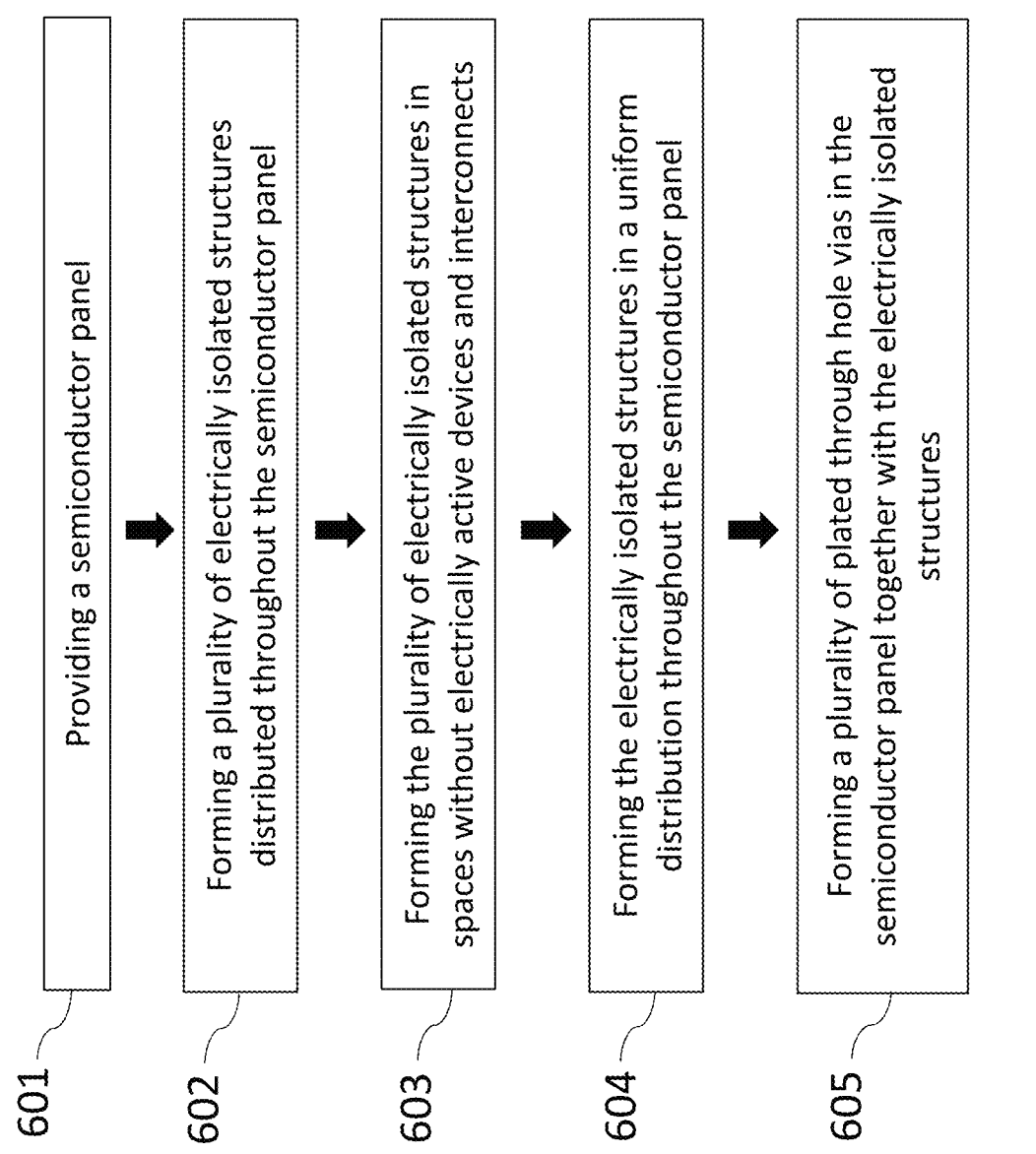

601    Providing a semiconductor panel

602    Forming a plurality of electrically isolated structures distributed throughout the semiconductor panel 603    Forming the plurality of electrically isolated structures in spaces without electrically active devices and interconnects 604    Forming the electrically isolated structures in a uniform distribution throughout the semiconductor panel 605    Forming a plurality of plated through hole vias in the semiconductor panel together with the electrically isolated structures

FIG. 6

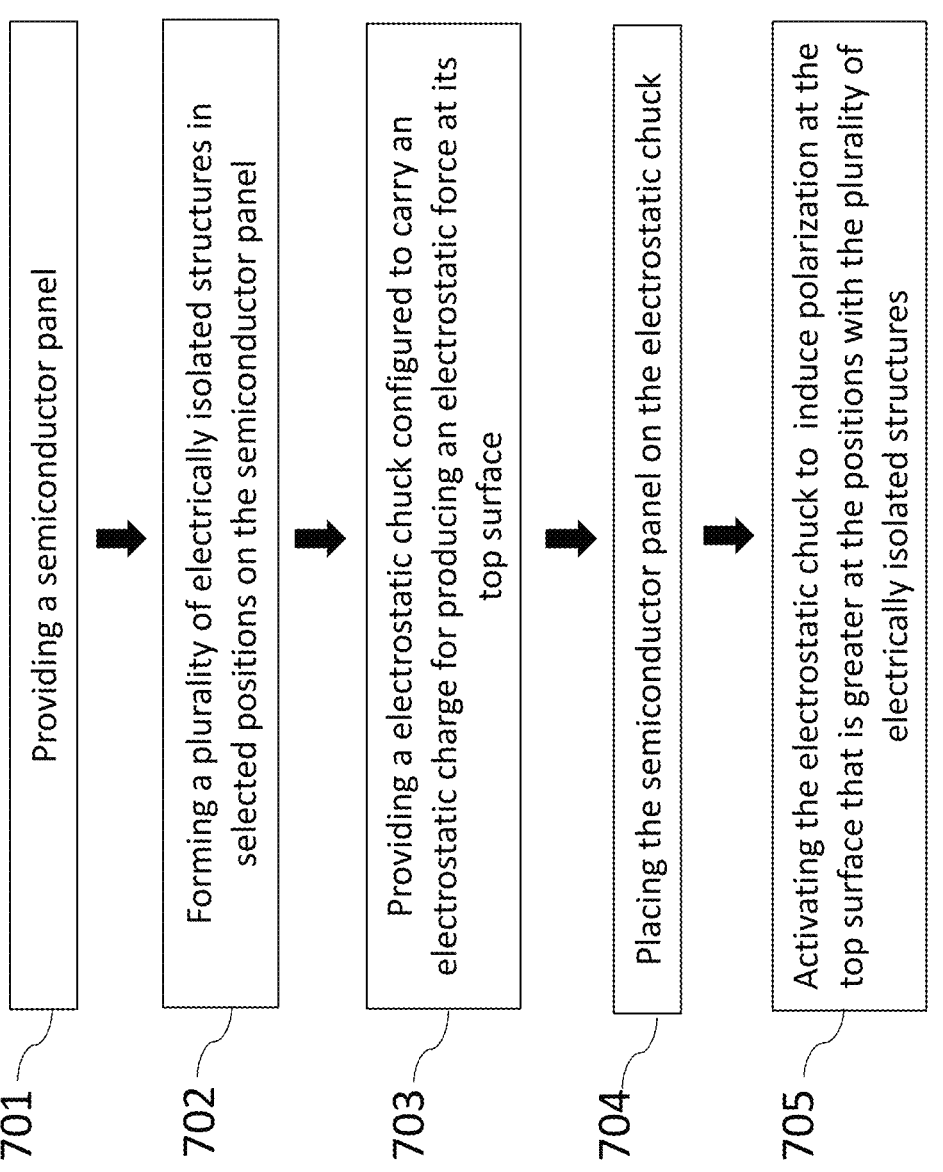

701 Providing a semiconductor panel

702 Forming a plurality of electrically isolated structures in selected positions on the semiconductor panel 703 Providing a electrostatic chuck configured to carry an electrostatic charge for producing an electrostatic force at its top surface 704 Placing the semiconductor panel on the electrostatic chuck 705 Activating the electrostatic chuck to induce polarization at the top surface that is greater at the positions with the plurality of electrically isolated structures

FIG. 7

SUBSTRATE ARCHITECTURE FOR ENHANCED ELECTROSTATIC CHUCKING

BACKGROUND

For integrated circuit design and fabrication, the need to improve performance and lower costs are constant challenges. Cost savings may be potentially realized by building dies on semiconductor panels rather than semiconductor wafers. By using a rectangular panel as a carrier, panel-level fan-out technology, which uses a molded embedded design, offers the potential for lower production cost due to a higher area utilization ratio of the carrier and better economical manufacturing, especially for large packages.

Presently, there are efforts to develop panel-level packaging technology that will follow a roadmap that will lead to increasingly larger panels, e.g., 500 mm by 500 mm panels and larger. However, there may be physical constraints in panel-level packaging that may hinder the use of larger panels, such as panel warpage, and the handling capability of processing tools, which may render processing operations extremely difficult to control and may result in low yields.

Many of the processing tools that are used in operations for semiconductor panels rely on electrostatic chucks (ESCs). The ability of ESCs to securely hold a semiconductor panel may be degraded by the use of thick panels with low-k cores and by the addition of greater numbers of active layers, which decrease the coulombic chucking force of ESCs. It is therefore critically important to enable panel-level processing that does not rely solely on ESC-based solutions.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 6 shows a simplified flow diagram for an exemplary method according to an aspect of the present disclosure; and FIG. 7 shows a simplified flow diagram for another exemplary method according to an aspect of the present disclosure.

DETAILED DESCRIPTION

Figures 1, 1A, 1B:
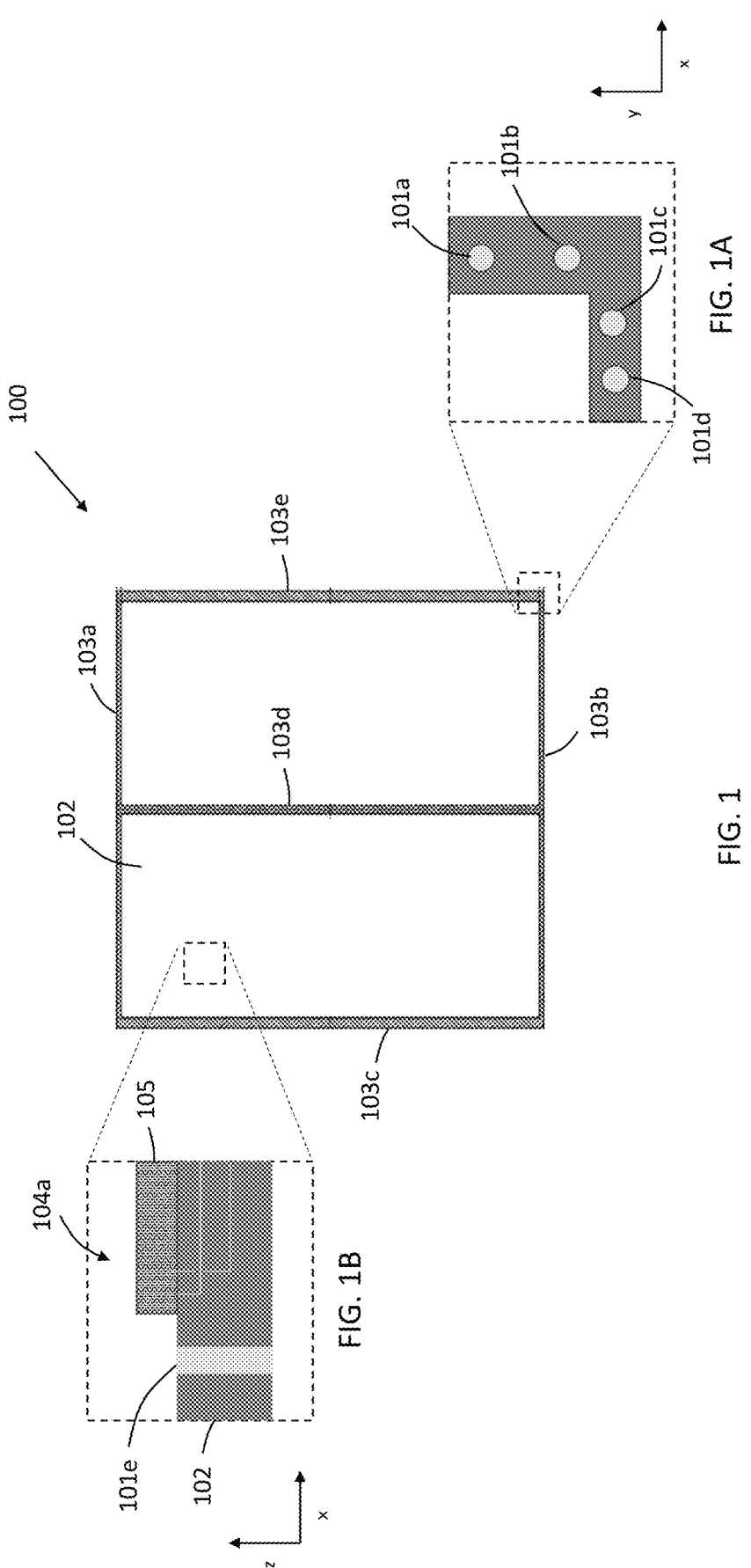
FIGS. 1, 1A, and 1B show exemplary representations of a semiconductor panel with electrically isolated structures according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for substrates and devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure provides solutions that incorporate electrically isolated metal structures with a through-thickness element for semiconductor panels to enable higher effective permittivity leading to enhanced electrostatic chucking force. The present solution may also aid the manufacturability of semiconductor panels (especially for thicker cores, glass core panels, and high-thickness panel process steps) by reducing the sensitivity to substrate design. The enhancement of electrostatic chucking force may be enabled by using a semiconductor panel substrate having electrically isolated metal structures that may be similar to plated-through hole types of structures, with through-core connectivity that may take the form of a wide range of geometries, and may be evenly distributed across the panel. For example, a high density of such electrically isolated metal structures may be positioned in each unit in "dummification" regions or dead spaces of the unit or semiconductor panel that may enhance an ESC's attachment capability at each process step or layer of the substrate process flow.

The present disclosure is directed to a semiconductor panel including a laminated structure with top and bottom surfaces, and a plurality of electrically isolated structures distributed throughout the laminated structure, for which the electrically isolated structures are functionally restricted to and solely purposed for increasing the attraction force between the laminated structure/panel and an electrostatic chuck (i.e., localizing the polarization effect to the electrically isolated structures). In an aspect, the electrically isolated structures may be positioned in spaces in the semiconductor panel without electrically active devices and interconnects (i.e., being uncoupled and functionally isolated, which further enhances the ability of the electrically isolated structures to increase the attractive force between the semiconductor panel and an electrostatic chuck. In a further aspect, the electrically isolated structures may be uniformly distributed throughout the laminated structure of the semiconductor panel.

In another aspect, the present disclosure is directed to a method providing a semiconductor panel and forming a plurality of electrically isolated structures distributed throughout the semiconductor panel that are functionally restricted to increase an attraction between the semiconductor panel and an electrostatic chuck. In an aspect, the electrically isolated structures may be formed together with the operations for forming plated through hole vias.

In yet another aspect, the present disclosure is directed to a method providing a semiconductor panel and forming a plurality of electrically isolated structures in selected positions on the semiconductor panel, providing an electrostatic chuck configured to carry an electrostatic charge for producing an electrostatic force at its top surface, placing the semiconductor panel on the electrostatic chuck, and activating the electrostatic chuck to induce polarization at the top surface to produce an attractive force between the semiconductor panel and the electrostatic chuck. In an aspect, the polarization may have a greater magnitude at the positions with the plurality of electrically isolated structures.

The technical advantages of the present disclosure include, but are not limited to:

(i) Providing a substrate architecture for panels that enhances the functionality of electrostatic chucks by reducing the sensitivity to substrate design;

(ii) Providing electrically isolated structures that are suitable for glass-core panels and thick panels with low-k cores; and (iii) Providing improved handling capability for panel-level unit high-volume manufacturing and improved yields.

To more readily understand and put into practical effect the present semiconductor panel substrate architecture for enhanced electrostatic chucking, which may be used for panel-level manufacturing to improve yield and performance, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, an exemplary representation of a semiconductor panel 100 according to an aspect of the present disclosure. The semiconductor panel 100 may include a laminated structure 102 and there may be designated portions of the laminated structure 102 along the edges and in the center, which are shown as 103a, 103b, 103c, 103d, and 103e, that are typically referred to as "keep out zones" and are spaces purposefully left without electrically active devices and/or interconnects. For example, the keep-out zones 103a and 103b may have widths of approximately 5 mm, and the keep-out zones 103c, 103d, and 103e may have widths of approximately 10-12 mm. In an aspect, the laminated structure 102 may include a glass core (not shown) as a layer in the semiconductor panel 100.

In an aspect, as shown in FIG. 1A, an exemplary expanded view of a section of the keep-out zone of the semiconductor panel 100, a plurality of electrically isolated structures 101a, 101b, 101c, and 101d may be formed in the keep-out zone, which may be a highly suitable space for the present electrically isolated structures according to an aspect of the present disclosure. The present electrically isolated structures may be a metal body (e.g., copper, aluminum, etc.) embedded in a dielectric material, such as ones conventionally used to make laminated substrates, and functionally isolated and restricted to increasing the attractive force between the semiconductor panel and an electrostatic chuck (i.e., enhancing the local polarization effects to the electrically isolated structure). It should be understood that the present electrically isolated structures may be preferably uniformly distributed throughout the portions 103a, 103b, 103c, 103d, and 103e of the semiconductor panel 100.

In another aspect, as shown in FIG. 1B, an exemplary expanded view of an "active" section of the semiconductor panel 100 may have a semiconductor package 104 (partially shown) according to an aspect of the present disclosure. The semiconductor package 104, and other semiconductor packages (not shown) may be formed, as repeating units, from the laminated structure 102, which may constitute a package substrate that has routing layers and other interconnects, and a plurality of devices, shown as a representative device 105, coupled to it. In an aspect, the laminated structure 102 may include panel-level fan-out packaging technology. According to an aspect of the present disclosure, the semiconductor package 104 may include one or more present electrically isolated structures, which is shown as 101e. In this aspect, the electrically isolated structure 101e may be formed in a space in the package substrate 102 that has no electrically active devices and/or interconnects, which may enhance and/or increase the attraction force between the laminated structure/panel and an electrostatic chuck (i.e., localizing the polarization effect to the electrically isolated structure). It should be understood that the present electrically isolated structures may be uniformly distributed throughout the laminated structure 102 among the plurality of semiconductor packages 104 of the semiconductor panel 100 but it is not required for every semiconductor package to have an electrically isolated structure.

Figure 2:
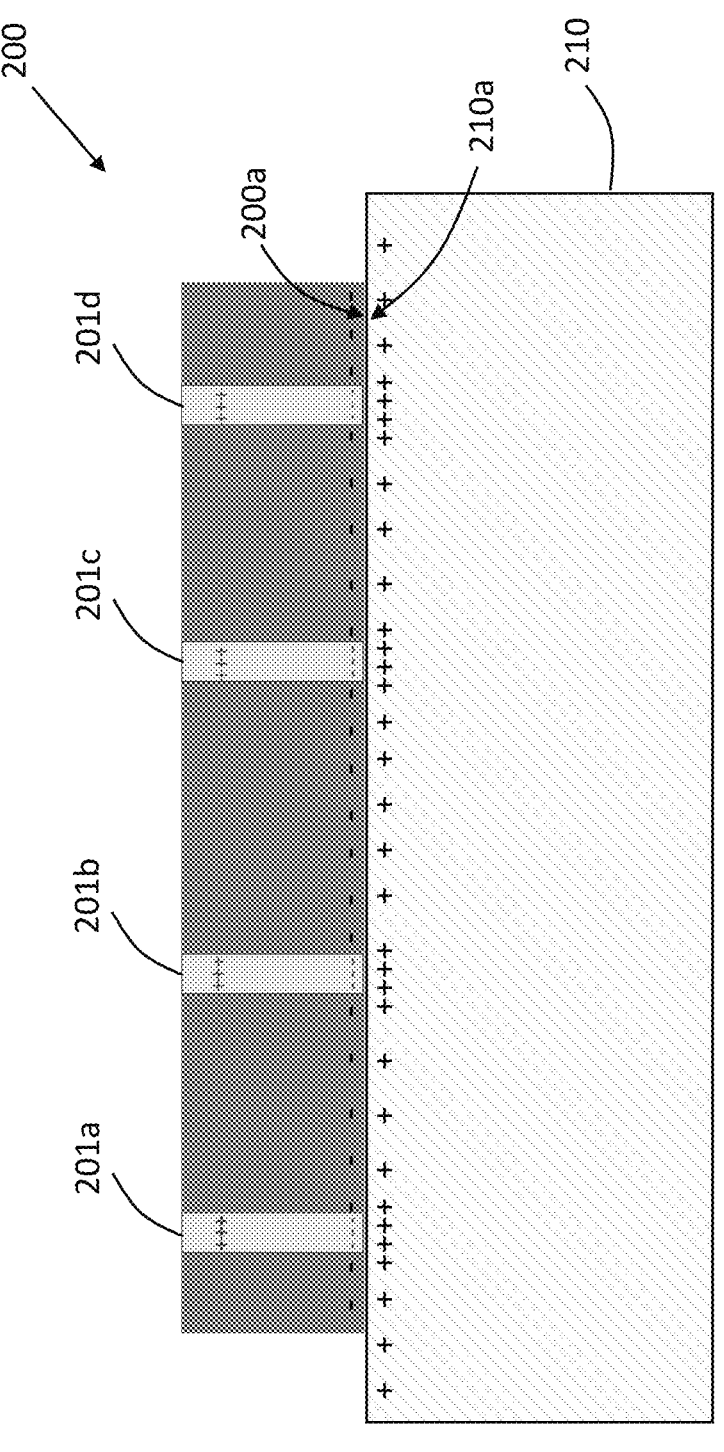
FIG. 2 shows an exemplary representation of a semiconductor panel with electrically isolated structures positioned on an electrostatic chuck according to an aspect of the present disclosure.

FIG. 2 shows an exemplary representation of a semiconductor panel 200 with a plurality of electrically isolated structures 201a, 201b, 201c, and 201d according to an aspect of the present disclosure. The semiconductor panel 200 has a bottom surface 200a that is positioned on a top 210a of an electrostatic chuck 210. The electrostatic chuck 210 may be activated to induce polarization at the top surface 210a to produce an attractive force between the semiconductor panel 200 and the electrostatic chuck 210. In an aspect, the magnitude of the polarization may be greater at the positions with the plurality of electrically isolated structures 201a, 201b, 201c, and 201d as shown representationally at the interface between the bottom surface 200a of semiconductor panel 200 and the top 210a of an electrostatic chuck 210. It should be understood that the presently electrically isolated structures have an electrical functionality that is restricted and solely purposed to increase an attraction between a semiconductor panel and an electrostatic chuck.

Figures 3A, 3B, 3C:
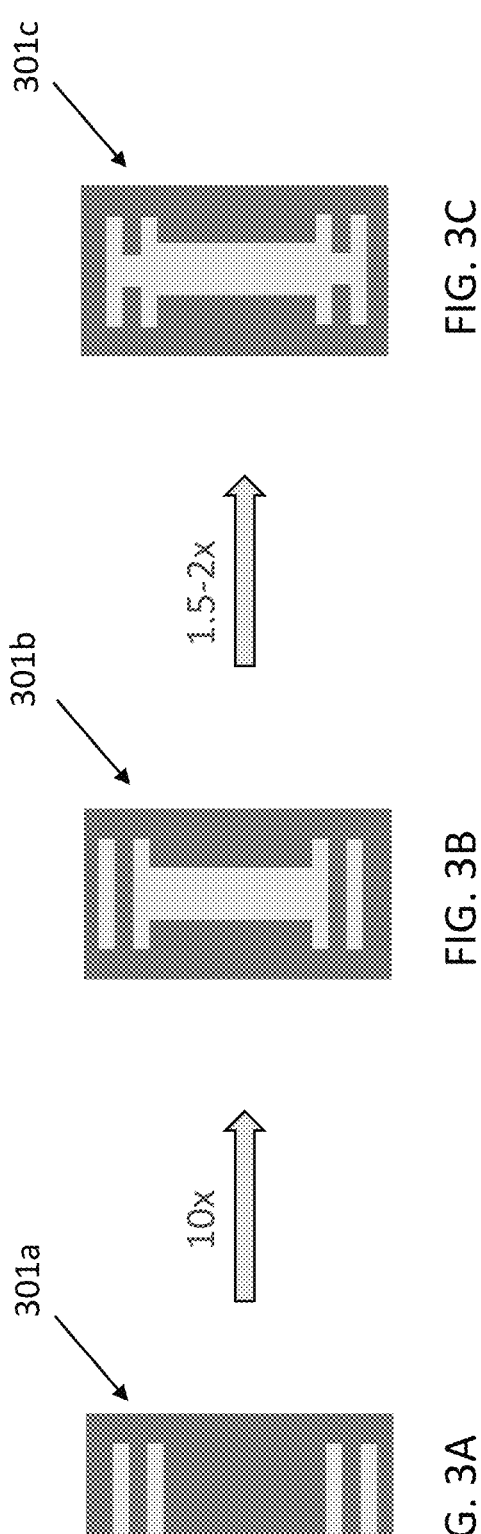
FIGS. 3A, 3B, and 3C show a comparison between exemplary electrically isolated structures according to an aspect of the present disclosure.

In FIGS. 3A, 3B, and 3C, a comparison between three exemplary electrically isolated structures is shown. In an aspect shown in FIG. 3A, the electrically isolated structure 301a has two pairs of thin elements (inner and outer) located near the top and bottom surfaces, while the electrically isolated structure 301b shown in FIG. 3B has an additional through-core element connecting the inner thin elements of the top and bottom pairs. In FIG. 3C, the electrically isolated structure 301c has an additional through-core element connecting the inner thin elements of the top and bottom pairs and connectors between the inner and outer thin elements of the pairs. According to an aspect of the present disclosure, the electrostatic attractive force with an electrostatic chuck may be approximately 10× greater when using the electrically isolated structure 301b as compared with the electrically isolated structure 301a, and approximately 1.5-2× greater when using the electrically isolated structure 301c as compared with the electrically isolated structure 301b.

Figures 4A, 4B, 4C:
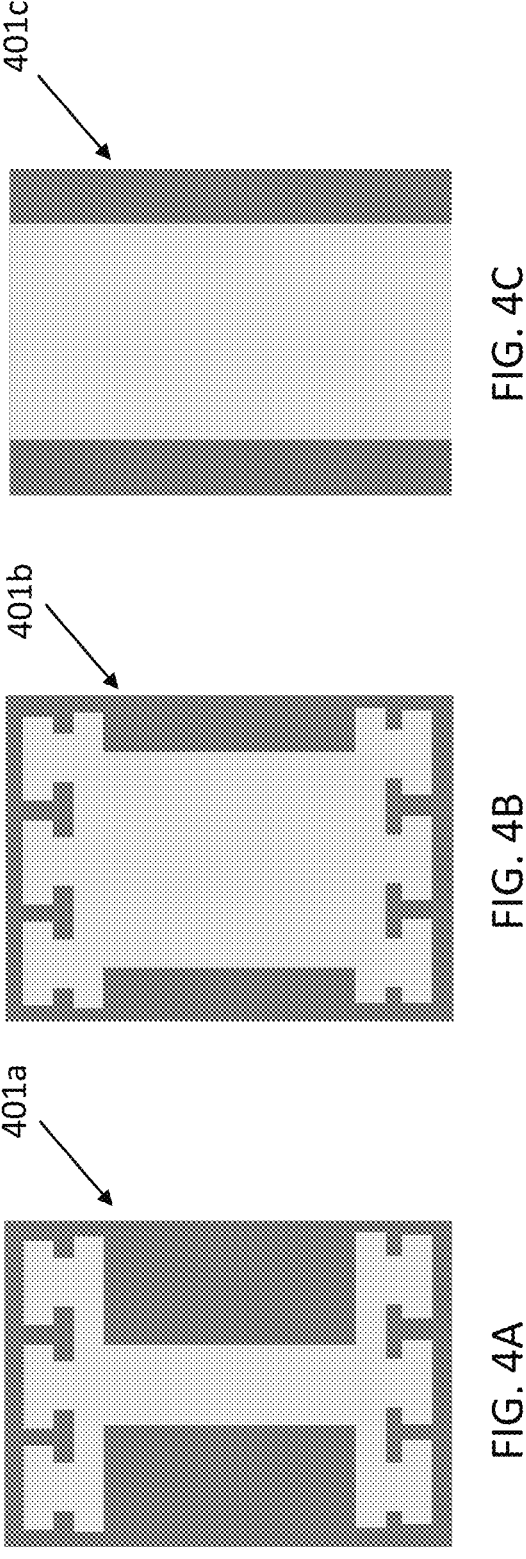
FIGS. 4A, 4B, and 4C show three exemplary electrically isolated structures according to an aspect of the present disclosure.

FIGS. 4A, 4B, and 4C show three exemplary electrically isolated structures 401a, 401b, and 401c according to an aspect of the present disclosure. The present electrically isolated structures may have a variety of different forms, as shown in the examples provided in FIGS. 4A, 4B, and 4C, which may include forms resulting from the patterning provided in a particular mask being used for a layer of features. For example, present electrically isolated structures may be formed together with other plated-through-hole (PTH) vias to avoid additional processing steps, so long as the electrically isolated structures remain uncoupled to any devices or elements (i.e., restricted electrical functionality). In an aspect, the electrically isolated structure 401c may have a straightforward, simple geometry, e.g., a cylinder, a square or rectangular pillar, or other shapes that extend to the top and bottom surface of a semiconductor panel (not shown).

Figure 5:
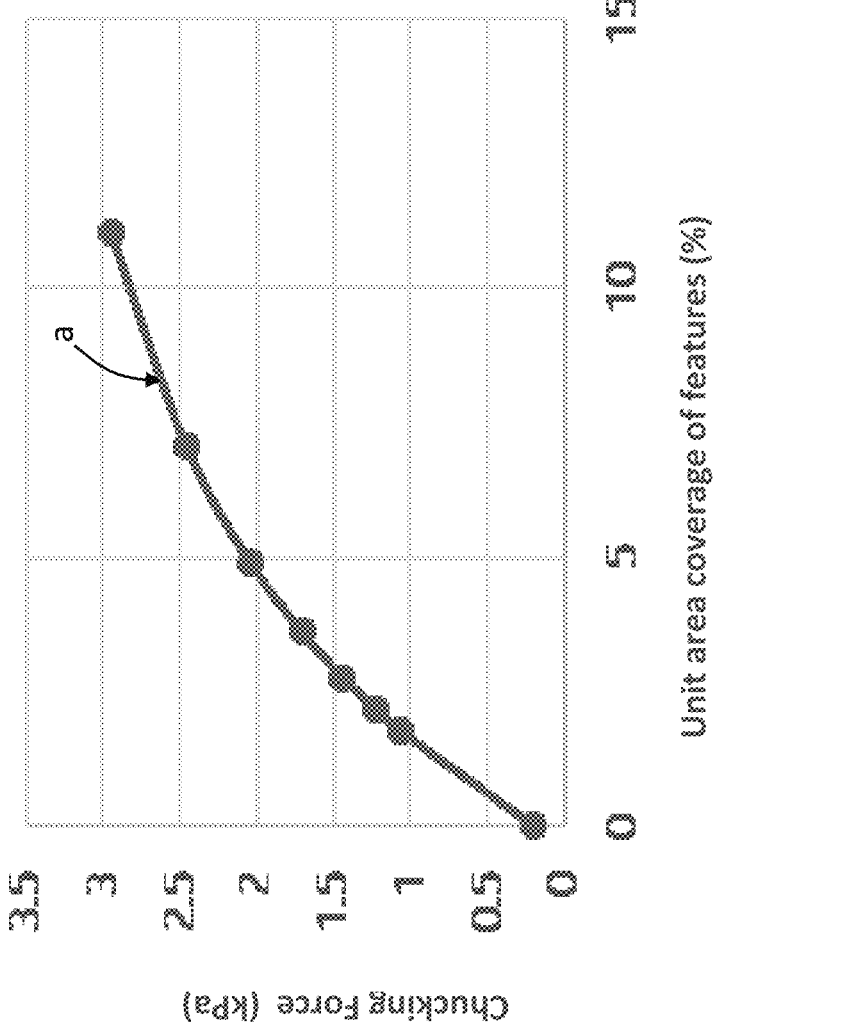
FIG. 5 shows an exemplary curve for the effect of increasing the area/number of electrically isolated structures in a semiconductor panel according to an aspect of the present disclosure.

In FIG. 5, an effect of increasing the area of "coverage" of the electrically isolated structures, which may come from a large cross-sectional dimension and/or the total number used in a semiconductor panel, may be represented by curve a. For example, using electrically isolated structures made of copper through holes may be able to enhance the overall coloumbic chucking force of a representative periodic semiconductor package/unit cell by ~10×, since it may minimize the potential drop across the semiconductor panel thickness. According to an aspect shown in curve a, an electrostatic chuck may provide an enhanced attractive electrostatic force that raises dramatically and begins to level off after the area coverage provided by the electrically isolated structures on a semiconductor panel exceeds 10 percent. In this aspect, the total area coverage requirement using the electrically isolated structure to produce this enhancement is not very high (~10% of effective unit area based on diameter to pitch ratio of the features). In another aspect, the enhanced attractive electrostatic force provided by the use of the electrically isolated structures may permit the operation of an electrostatic chuck at reduced energy levels, i.e., voltage, and provide cost savings.

FIG. 6 shows a simplified flow diagram for an exemplary method according to an aspect of the present disclosure.

The operation 601 may be directed to providing a semiconductor panel.

The operation 602 may be directed to forming a plurality of electrically isolated structures distributed throughout the semiconductor panel.

The operation 603 may be directed to forming the plurality of electrically isolated structures in spaces without electrically active devices and interconnects.

The operation 604 may be directed to forming the electrically isolated structures in a uniform distribution throughout the semiconductor panel.

The operation 605 may be directed to forming a plurality of plated through hole vias in the semiconductor panel together with the electrically isolated structures.

FIG. 7 shows a simplified flow diagram for another exemplary method according to an aspect of the present disclosure.

The operation 701 may be directed to providing a semiconductor panel.

The operation 702 may be directed to forming a plurality of electrically isolated structures in selected positions on the semiconductor panel.

The operation 703 may be directed to providing an electrostatic chuck configured to carry an electrostatic charge for producing an electrostatic force at its top surface.

The operation 704 may be directed to placing the semiconductor panel on the electrostatic chuck.

The operation 705 may be directed to activating the electrostatic chuck to induce polarization at the top surface that is greater at the positions with the plurality of electrically isolated structures.

It will be understood that any property described herein for a specific semiconductor panel substrate architecture may also hold for any semiconductor panel described herein. It will also be understood that any property described herein for a specific method may hold for any of the methods described herein. Furthermore, it will be understood that for any semiconductor panel and the methods described herein, not necessarily all the components or operations described will be shown in the accompanying drawings or method, but only some (not all) components or operations may be disclosed.

To more readily understand and put into practical effect the present semiconductor carrier platforms and thermal stability layers, they will now be described by way of examples. For the sake of brevity, duplicate descriptions of features and properties may be omitted.

EXAMPLES

Example 1 provides a semiconductor panel including a laminated structure with top and bottom surfaces, and a plurality of electrically isolated structures distributed throughout the laminated structure, for which the electrically isolated structures having electrical functionality that is restricted to increasing an attraction between the laminated structure and an electrostatic chuck.

Example 2 may include the semiconductor panel of example 1 and/or any other example disclosed herein, for which the electrically isolated structures are positioned in spaces in the semiconductor panel without electrically active devices and interconnects.

Example 3 may include the semiconductor panel of example 2 and/or any other example disclosed herein, for which the electrically isolated structures are uniformly distributed throughout the laminated structure.

Example 4 may include the semiconductor panel of example 1 and/or any other example disclosed herein, for which the electrically isolated structures extend from the top surface to the bottom surface through a core of the laminated structure.

Example 5 may include the semiconductor panel of example 4 and/or any other example disclosed herein, for which the electrically isolated structures minimize the potential drop between the top surface and the bottom surface of the laminated structure.

Example 6 may include the semiconductor panel of example 3 and/or any other example disclosed herein, for which the laminated structure includes panel-level fan-out packaging.

Example 7 may include the semiconductor panel of example 6 and/or any other example disclosed herein, for which the electrically isolated structures are placed in keep-out zones of the semiconductor panel.

Example 8 may include the semiconductor panel of example 6 and/or any other example disclosed herein, for which the electrically isolated structures are placed in spaces of the package substrates without electrically active devices and interconnects.

Example 9 may include the semiconductor panel of example 6 and/or any other example disclosed herein, which further includes optimizing the number of electrically isolated structures based on the size of the semiconductor panel to increase the attraction between the semiconductor panel and the electrostatic chuck.

Example 10 may include the semiconductor panel of example 1 and/or any other example disclosed herein, for which the electrically isolated structures comprise a cross-sectional area of approximately 10 percent of a total area for the laminated structure.

Example 11 may include the semiconductor panel of example 1 and/or any other example disclosed herein, for which the electrically isolated structures comprise a metal body embedded in a dielectric material.

Example 12 may include the semiconductor panel of example 3 and/or any other example disclosed herein, for which the laminated structure includes a carrier panel.

Example 13 provides a method that includes providing a semiconductor panel and forming a plurality of electrically isolated structures distributed throughout the semiconductor panel, for which the electrically isolated structures having electrical functionality that is restricted to increasing an attraction between the semiconductor panel and an electrostatic chuck.

Example 14 may include the method of example 13 and/or any other example disclosed herein, which further includes forming the plurality of electrically isolated structures in spaces without electrically active devices and interconnects.

Example 15 may include the method of example 13 and/or any other example disclosed herein, which further includes forming the electrically isolated structures in a uniform distribution throughout the semiconductor panel.

Example 16 may include the method of example 13 and/or any other example disclosed herein, which further includes forming a plurality of plated through hole vias in the semiconductor panel, for which the electrically isolated structures are formed together with the plated through hole vias.

Example 17 provides a method that provides a semiconductor panel, forming a plurality of electrically isolated structures in selected positions on the semiconductor panel, providing an electrostatic chuck configured to carry an electrostatic charge for producing an electrostatic force at its top surface, placing the semiconductor panel on the electrostatic chuck, activating the electrostatic chuck to induce polarization at the top surface to produce an attractive force between the semiconductor panel and the electrostatic chuck, for which a magnitude for the polarization is greater at the positions with the plurality of electrically isolated structures.

Example 18 may include the method of example 17 and/or any other example disclosed herein, for which the attractive force between the semiconductor panel and the electrostatic chuck increases as the plurality of electrically isolated structures becomes larger.

Example 19 may include the method of example 17 and/or any other example disclosed herein, for which the activation of the electrostatic chuck includes providing energy to the electrostatic chuck, for which the energy is reduced as the plurality of electrically isolated structure becomes larger.

Example 20 may include the method of example 17 and/or any other example disclosed herein, which further includes forming the electrically isolated structures in a uniform distribution throughout the semiconductor panel.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A semiconductor panel comprising:
   a laminated structure with top and bottom surfaces; and
   a plurality of electrically isolated structures distributed throughout the laminated structure, wherein the electrically isolated structures having electrical functionality that is restricted to increasing an attraction between the laminated structure and an electrostatic chuck.

2. The semiconductor panel of claim 1, wherein the electrically isolated structures are positioned in spaces in the semiconductor panel without electrically active devices and interconnects.

3. The semiconductor panel of claim 2, wherein the electrically isolated structures are uniformly distributed throughout the laminated structure.

4. The semiconductor panel of claim 1, wherein the electrically isolated structures extend from the top surface to the bottom surface through a core of the laminated structure.

5. The semiconductor panel of claim 4, wherein the electrically isolated structures minimize the potential drop between the top surface and the bottom surface of the laminated structure.

6. The semiconductor panel of claim 3, wherein the laminated structure comprises a panel-level fan-out packaging.

7. The semiconductor panel of claim 6, wherein the electrically isolated structures are placed in keep-out zones of the semiconductor panel.

8. The semiconductor panel of claim 6, wherein the semiconductor panel comprises a plurality of package substrates, wherein the electrically isolated structures are placed in spaces of the package substrates without electrically active devices and interconnects.

9. The semiconductor panel of claim 6, further comprised optimizing the number of electrically isolated structures based on the size of the semiconductor panel to increase the attraction between the semiconductor panel and the electrostatic chuck.

10. The semiconductor panel of claim 1, wherein the electrically isolated structures comprise a cross-sectional area of approximately 10 percent of a total area for the laminated structure.

11. The semiconductor panel of claim 1, wherein the electrically isolated structures comprise a metal body embedded in a dielectric material.

12. The semiconductor panel of claim 3, wherein the laminated structure comprises a carrier panel.

13. A method comprising:
   providing a semiconductor panel; and
   forming a plurality of electrically isolated structures distributed throughout the semiconductor panel, wherein the electrically isolated structures having electrical functionality that is restricted to increasing an attraction between the semiconductor panel and an electrostatic chuck.

14. The method of claim 13, further comprises forming the plurality of electrically isolated structures in spaces without electrically active devices and interconnects.

15. The method of claim 13, further comprises forming the electrically isolated structures in a uniform distribution throughout the semiconductor panel.

16. The method of claim 13, further comprises forming a plurality of plated through hole vias in the semiconductor panel, wherein the electrically isolated structures are formed together with the plated through hole vias.

17. A method comprising:

providing a semiconductor panel;

forming a plurality of electrically isolated structures in selected positions on the semiconductor panel;

providing an electrostatic chuck configured to carry an electrostatic charge for producing an electrostatic force at its top surface;

placing the semiconductor panel on the electrostatic chuck;

activating the electrostatic chuck to induce polarization at the top surface to produce an attractive force between the semiconductor panel and the electrostatic chuck, wherein a magnitude for the polarization is greater at the positions with the plurality of electrically isolated structures.

18. The method of claim 17, wherein the attractive force between the semiconductor panel and the electrostatic chuck increases as the plurality of electrically isolated structures becomes larger.

19. The method of claim 17, wherein the activation of the electrostatic chuck comprises providing energy to the electrostatic chuck, wherein the energy is reduced as the plurality of electrically isolated structure becomes larger.

20. The method of claim 17, further comprises forming the electrically isolated structures in a uniform distribution throughout the semiconductor panel.

* * * * *